United States Patent
Le et al.

(10) Patent No.: US 8,252,516 B2
(45) Date of Patent: *Aug. 28, 2012

(54) MANUFACTURING A NARROW TRACK READ HEAD

(75) Inventors: Quang Le, San Jose, CA (US); Jui-Lung Li, San Jose, CA (US)

(73) Assignee: HGST Netherlands, B.V., Amsterdam (NL)

(*) Notice: Subject to any disclaimer, the term of this patent is extended or adjusted under 35 U.S.C. 154(b) by 889 days.

This patent is subject to a terminal disclaimer.

(21) Appl. No.: 12/261,241

(22) Filed: Oct. 30, 2008

(65) Prior Publication Data

US 2010/0112487 A1    May 6, 2010

(51) Int. Cl.
*G11B 5/127* (2006.01)
(52) U.S. Cl. ..... 430/316; 430/313; 430/320; 29/603.07; 29/603.13
(58) Field of Classification Search ............... None
See application file for complete search history.

(56) References Cited

U.S. PATENT DOCUMENTS

| 7,037,847 | B2 | 5/2006 | Le et al. |
| 7,297,470 | B2 | 11/2007 | Cornwell et al. |
| 8,011,084 | B2* | 9/2011 | Le et al. ............ 29/603.16 |
| 2006/0044681 | A1 | 3/2006 | Le et al. |

* cited by examiner

*Primary Examiner* — Daborah Chacko Davis
(74) *Attorney, Agent, or Firm* — Duft Bornsen & Fishman, LLP (57) ABSTRACT

Embodiments of the invention operate to narrow the track width of a read head used in a disk drive. In one embodiment, a magnetic read head has a track width of about 40 nm or less. The read head is fabricated by a method that includes fabricating a film stack from a substrate, a sensor material, a stop material, a first release material, a mask material, and a photo resist material. The mask material may include a masking substrate material and a second release material. The film stack is processed by forming a read head image in the photo resist material, removing portions of the film stack that lie outside the read head image of the photo resist material, stripping the film stack to remove the photo resist, mask and first release materials, and milling the sensor material according to the read head image.

12 Claims, 12 Drawing Sheets

025B2
MANUFACTURING A NARROW TRACK READ HEAD

BACKGROUND OF THE INVENTION

1. Field of the Invention

The invention is related to the field of magnetic recording and, in particular, to the manufacture of a read head having a relatively narrow track width such that the data storage capabilities of magnetic disk drive systems may be increased.

2. Statement of the Problem

Magnetic disk drive systems are used in a variety of electrical devices for mass storage of information. The disk drive systems include a magnetic media disk and an assembly of write and read heads. The assembly of write and read heads is supported by a slider that is mounted on a suspension arm. The suspension arm biases the slider toward the magnetic media disk. When the magnetic media disk rotates, air flow generated by the rotation of the disk causes the slider to fly on a cushion of air at a very low elevation (fly height) over the disk. When the slider rides on the air, the actuator moves the suspension arm to position the write and read heads over selected data tracks on the magnetic media disk. The write and read heads write data to and read data from, respectively, data tracks on the magnetic media disk. Processing circuitry connected to the write and read heads then operates according to a computer program to implement writing and reading functions.

To construct the read head, a plurality of sensor layers are deposited across the surface of a substrate. A photolithographic process is then conducted such that an ion milling mask is "imaged" above the sensor layers to establish a magnetic read track width for the read head. An ion milling process then removes unmasked portions of the sensor layers to define the track width of the read head.

In order to achieve greater data storage density on the magnetic media, magnetic data bits are written in increasingly smaller sizes. The read heads are therefore fabricated with a reduced track width to properly read the smaller sized data bits. A reactive ion etching (RIE) process is used to "image" a pattern in a photo resist layer onto an ion mill hard mask. Then, the hard mask is ion milled to pattern the hard mask image into the sensor. A problem with this process exists with the limitation of the lithography tool that is used to produce the track-width of the read head. At relatively small dimensions, not enough photo resist material remains to effectively image transfer the photo resist onto the hard mask. Even if the image transfer step is successful, the combined thickness of the imaging layer and the hard mask results in a relatively high aspect ratio that causes "shadowing" effects in the structure. These shadowing effects cause tapering at the foot of the sensor after milling. The tapering makes the read head less effective due to the changing geometry. That is, a read head is more effective at reading data on a magnetic disk when its geometries are perpendicular, or square, with respect to the disk. Additionally, the structure tends to form "dips" adjacent to the sensor after hard bias deposition that make CMP (chemical mechanical polishing) less effective in removing extraneous materials.

SUMMARY OF THE INVENTION

Embodiments of the invention operate to narrow the track width of a read head used in a disk drive. In one embodiment, a method of manufacturing a read head includes fabricating a film stack by forming a sensor layer on a substrate. The sensor layer is configured from a magnetic material. The method also includes forming a stop layer on the sensor layer that is configured from a material that deters removal of the sensor layer during chemical mechanical polishing. The method also includes forming a release layer on the stop layer that is configured from a first release material. Then, a mask layer is formed on the release layer from a material that transfers an image of the read head from a photo resist layer onto the release layer. This includes layering a second release material between the mask layer and the photo resist layer. The method also includes forming the photo resist layer on the mask layer. Once formed, the film stack is processed by patterning the read head image in the photo resist layer and etching the stop layer, the release layer and the mask layer according to the patterned read head image. Thereafter, the photo resist layer, the mask layer, and the release layer may be removed via an aqueous stripping process and the sensor layer ion milled according to the patterned read head image of the remaining stop layer.

In another embodiment, a method of manufacturing a read head includes fabricating a film stack by forming a sensor layer on a substrate from a magnetic material. The method also includes forming a stop layer on the sensor layer from a material that deters removal of the sensor layer during chemical mechanical polishing. Then, a mask layer is formed on the stop layer from a material that transfers an image of the read head from a photo resist layer onto the stop layer. The step of forming the mask layer includes layering a release material between the mask layer material and the photo resist layer. Then, the photo resist layer is formed on the mask layer. Once the film stack is formed, the read head image is patterned in the photo resist layer and the stop layer and the mask layer are etched according to the patterned read head image. Thereafter, the photo resist layer and the mask layer are removed via an aqueous stripping process and the sensor layer is ion milled according to the patterned read head image of the remaining stop layer.

The invention may include other exemplary embodiments described below.

DESCRIPTION OF THE DRAWINGS

The same reference number represents the same element or same type of element on all drawings.

DETAILED DESCRIPTION OF THE INVENTION

FIGS. 1-23 and the following description depict specific exemplary embodiments of the invention to teach those skilled in the art how to make and use the invention. For the purpose of teaching inventive principles, some conventional aspects of the invention have been simplified or omitted. Those skilled in the art will appreciate variations from these embodiments that fall within the scope of the invention. Those skilled in the art will also appreciate that the features described below can be combined in various ways to form multiple variations of the invention. As a result, the invention is not limited to the specific embodiments described below, but only by the claims and their equivalents.

Figure 1:
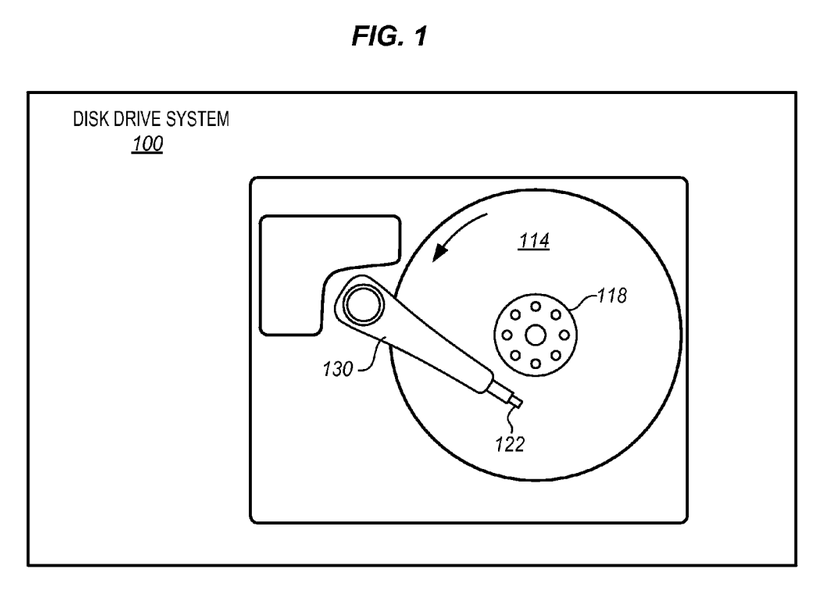
FIG. 1 is a simplified overhead view of a disk drive including the read head of the present invention.

A simplified overhead view of a typical disk drive system 100 which is suitable to include a read head of the present invention is presented in FIG. 1. In the disk drive system 100, one or more magnetic disks 114 are rotatably mounted upon a motorized spindle 118. A slider 122, having the read head fabricated thereon, is mounted upon an actuator arm 130 to "fly" above the surface of each rotating magnetic disk 114, as is well known to those skilled in the art. The read head is generally formed using a fabrication process that produces large quantities of read heads, similar to a semiconductor manufacturing process. For example, a sensor material is typically layered on a substrate material. Other materials are then layered on the sensor and subsequently removed during the fabrication process. The layering and removal steps of the fabrication process are generally designed in such a way as to narrow the track width of the sensor head so that more data may be stored on the magnetic disk 114. The present invention includes improved features and manufacturing methods for such read heads 126 (shown in FIG. 3).

Figure 2:
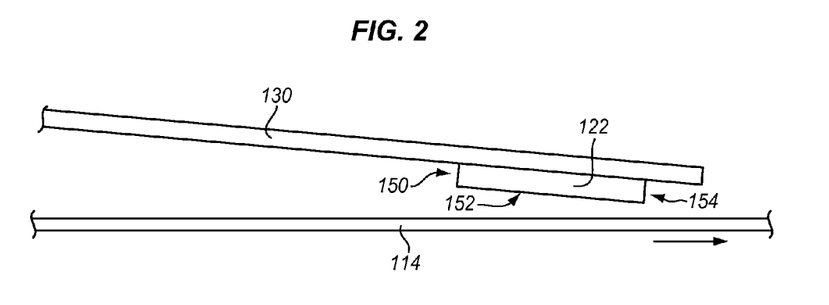
FIG. 2 is a side view of a disk drive system.

FIG. 2 is a side view of the disk drive system 100. The slider 122 is supported above magnetic disk 114 by an actuator arm 130. The slider 122 includes a front end 150 and an opposing trailing end 154. The slider 122 also includes an air bearing surface (ABS) 152 that faces toward the surface of the magnetic disk 114. A write head (not shown) and a read head (not shown) are formed proximate to trailing end 154, which is further illustrated in FIG. 3.

Figure 3:
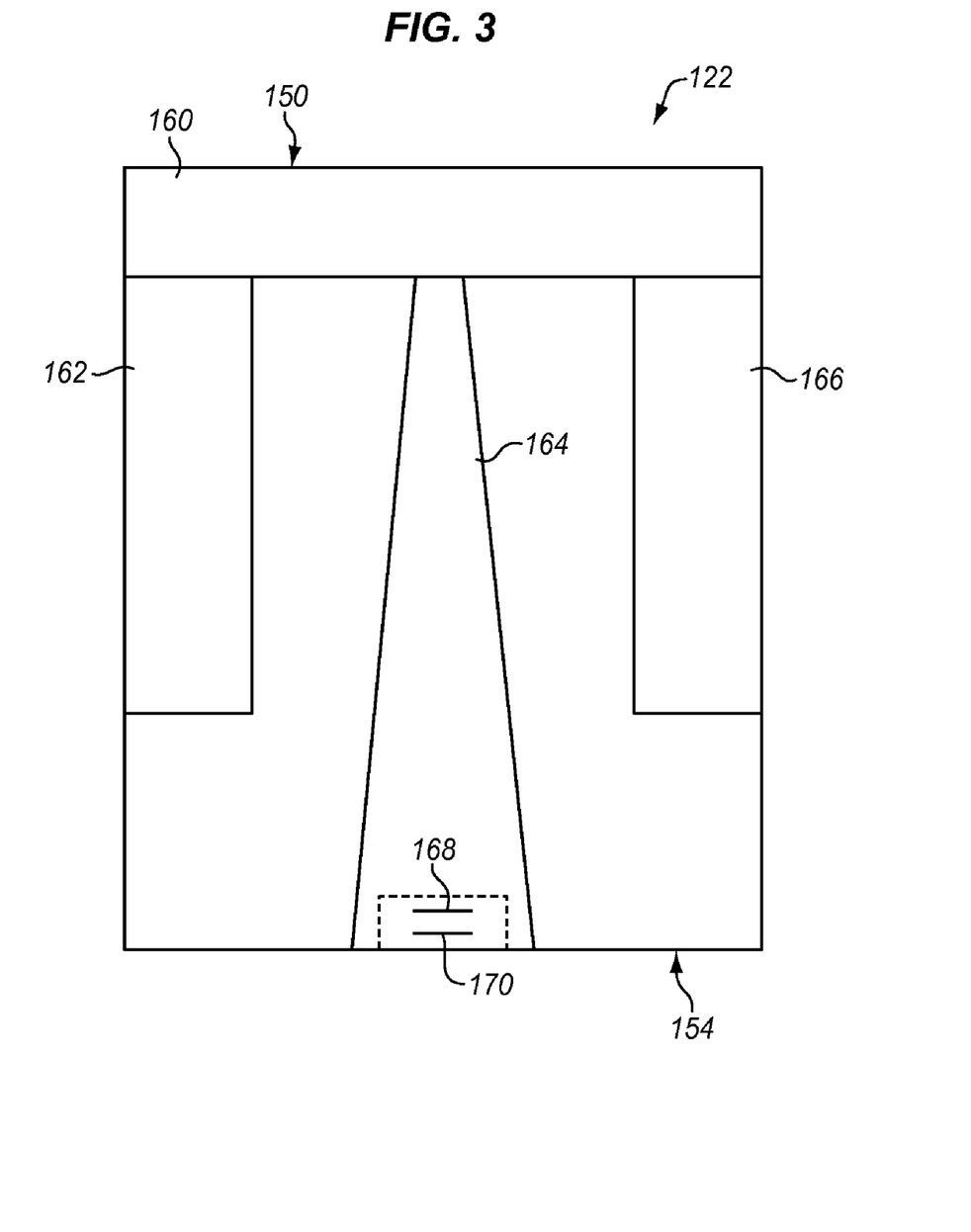
FIG. 3 is an ABS view of a slider of a disk drive system.

FIG. 3 is an ABS view of the slider 122. The ABS 152 of the slider 122 is the surface of the page in FIG. 3. The slider 122 has a cross rail 160, two side rails 162 and 166, and a center rail 164 on the ABS 152. The rails, which define how the slider 122 flies over the surface of magnetic disk 114, illustrate just one embodiment, and the configuration of the ABS 152 of the slider 122 may take on any desired form. The slider 122 includes a write head 170 and a read head 126 fabricated proximate to the trailing end 154.

FIGS. 4-14 are elevational views depicting a series of chemical mechanical polishing (CMP) assisted liftoff fabrication process utilized in fabricating the read head 126 in an exemplary embodiment of the invention. In this embodiment, a film stack 200 is configured from the layering of materials on a substrate 201. A magnetic material 202 used in performing the read functionality of the read head 126 is layered on the substrate 201. A CMP stop layer 203 is then fabricated on the surface of the sensor material 202. One type of material that may be used as the CMP stop layer 203 is a diamond-like-carbon (DLC) with silicon as an adhesion layer (Si). The CMP stop layer 203 is generally intended to mitigate erosion of the sidewalls of the film stack 200 during fabrication. Thus, the CMP stop layer 203 may function as a "hard mask" to pattern the sensor during ion milling. When using DLC, the DLC density may range between 1.8-2.9 g/cc and stress less –4 GPa. Generally, a higher density of DLC equates to a thinner layer of carbon that serves both as an effective hard mask and a CMP stop layer. Thus, a higher density layer of the DLC may allow the CMP stop layer 203 to be used as a relatively thin hard mask that reduces the height of redeposited materials on the side of the carbon, or "notch", after CMP. The net result is a relatively flat junction at the sides of the read sensor 126 and a "flat" upper shield/lead.

After the CMP stop layer 203 has been deposited on the sensor material 202, a release layer 204 is deposited on the CMP stop layer 203. The release layer 204 may be used to more readily remove subsequent layers in the film stack 200. For example, reactive ion etching (RIE) may be used to form the shape of the read head in the film stack 200. In doing so, the RIE may remove portions of the film stack 200 down to the sensor material 202 to form the "track width" of the read head 126. With the shape of the read head 126 formed in the film stack 200, the upper layers of the film stack 200 may be removed using a stripping process that leaves the CMP stop layer 203 and the sensor material 202. Thereafter, the sensor material 202 may be ion milled so as to create relatively vertical walls (see e.g., FIG. 9) for the read head 126 based on the remaining CMP stop layer 203. In one embodiment, the release layer 204 is the material "Durimide" as produced by Arch Chemicals, Inc. of Norwalk Conn. The release layer 204 may also act as a bottom anti-reflective coating (BARC) which provides relatively good absorption of 193 nm light to suppress standing waves and minimize the sensitivity of a photo resist's line width. Moreover, the release layer 204 is soluble in an NMP (N-methylpyrrolidone) solution, which is effective in removing the stencil and redeposited materials.

Figure 4:
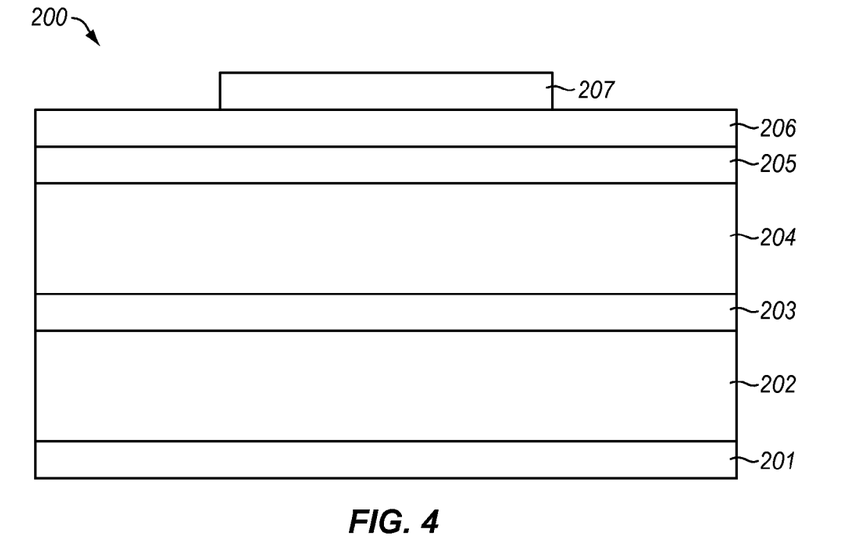
FIGS. 4-14 are elevational views depicting a series of steps in a chemical mechanical polishing assisted liftoff fabrication process utilized in fabricating the read head in an exemplary embodiment of the invention.

After depositing the release layer 204, a mask layer 205 is deposited on the release layer 204. The mask layer 205 may be used to protect the underlying release layer 204 and CMP stop layer 203 during processes that define the read head 126 in the photo resist layer 207. The mask layer 205 may also serve as a hard mask to pattern the underlying release layer 204 and the CMP stop layer 203. In one embodiment, the mask layer 205 is $Si_3N_4$, however, other suitable materials may be used. Examples of other suitable materials may include $SiO_2$, $SiO_xN_y$, Ta, $Ta_2N_3$, $Ta_2O_5$, and W. The mask layer 205 is also configured with a BARC and release layer 206 that resides between the predominant material of the mask layer 205 (e.g., a masking substrate) and the photo resist layer 207 for reasons already described. Afterwards, the mask layer 205 is layered with the photo resist layer 207 which provides track lines used in configuring the track width of the read head.

Photo resist lines previously collapsed at certain height/width aspect ratios such that unwanted portions of the photo resist material remained when baked at a temperature above the glass transition. One material that may be used to overcome such problems includes the TIS 51-23 photo resist material also produced by Arch Chemicals, Inc. TIS 51-23 provides relatively good imaging characteristics and relatively good resistance to RIE in an $O_2$ environment. The combination of $Si_3N_4$ (e.g., the mask layer 205), Durimide, and TIS may allow read head track width slimming without damage to the underlayer. Also, $Si_3N_4$ may serve as a hard mask that patterns the layers 203 and 204 during an RIE process once the photo resist layer 207 is transferred into the $Si_3N_4$ layer (e.g., the layer 205).

Figure 5:
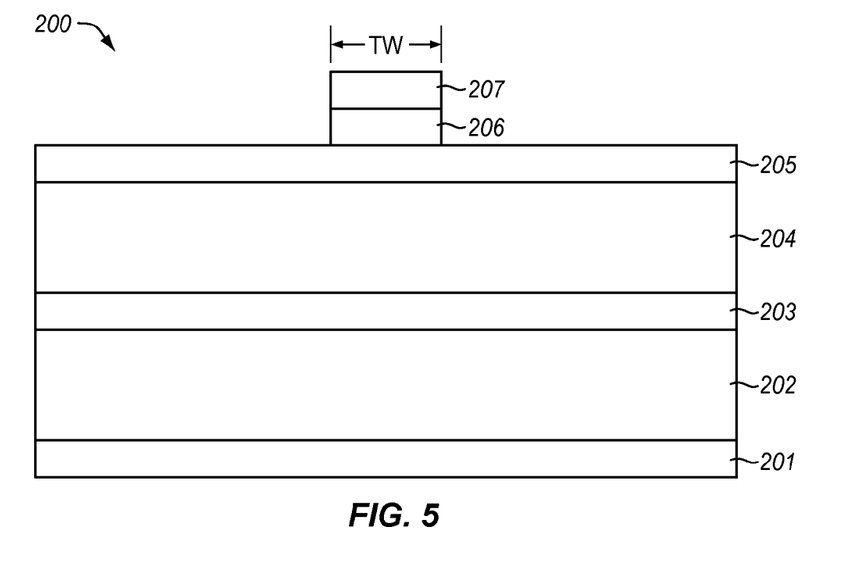

With the film stack 200 formed, processing of the film stack 200 may be performed to pattern the read head 126 in the sensor material 202. In this embodiment, processing of the film stack 200 initiates by defining the track width (TW) of the read head within the photo resist layer 207. Assuming a photo resist layer 207 configured from the material TIS 51-23, the track width of the read head may be defined by exposing the photo resist layer 207 to reactive ion etching (RIE) using oxygen ($O_2$) gas at 25° C. This has a dual effect of controllably narrowing the TIS 51-23 photo resist layer 207 and image transferring the read head track width into the Durimide or other polymer (e.g., layer 206). This process results in a read head track width of about 40 nm or less, as shown in FIG. 5. For example, during RIE with $O_2$ RIE gas, the Si in layer 207 "passivates" the photo resist so as to provide more RIE resistance. RIE may then be extended into layer 206 by laterally etching the layer 206 to slim down the read head track width. In another embodiment, Ozone ($O_3$) gas at a temperature between about 90° C. and 120° C. can also be used to slim the photo resist layer 207. In this case, the photo resist layer 207 is a material that does not contain Si for slimming and the layer 206 is omitted such that $O_3$ may be used to reduce the read head track width.

Figure 6:
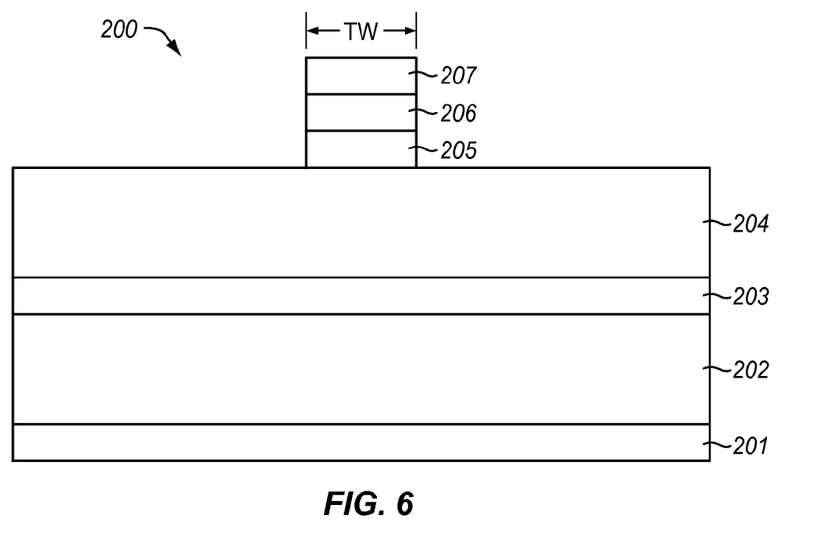
Figure 7:
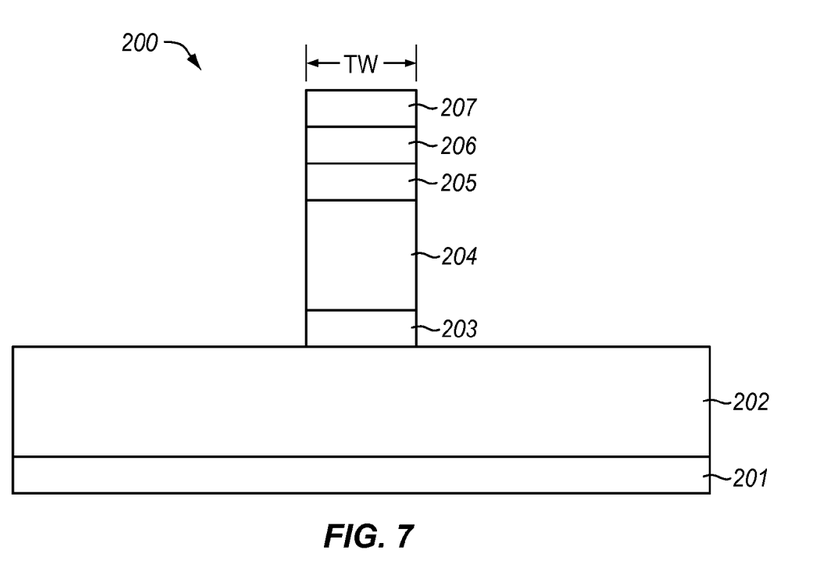

Once the track width is defined in the photo resist layer 207, the mask layer 205 may be patterned using an RIE process that exposes the film stack 200 the $CF_4/CHF_3$ RIE chemistries. This RIE process may have the effect of removing the mask layer 205 outside the areas defined by the photo resist layers 207 and 206, as shown in FIG. 6, thereby providing a means for imaging the read head pattern into the hard mask 205. Afterwards, the remainder of the film stack 200 may be exposed to an RIE process that removes portions of the release layer 204 and the CMP stop layer 203 also outside the areas defined by the photo resist layer 207, as shown in FIG. 7 to transfer the read sensor image further into the film stack 200. This RIE process may include exposing the film stack 200 to a different material, such as $CO_2$ or $O_2$.

Figure 8:
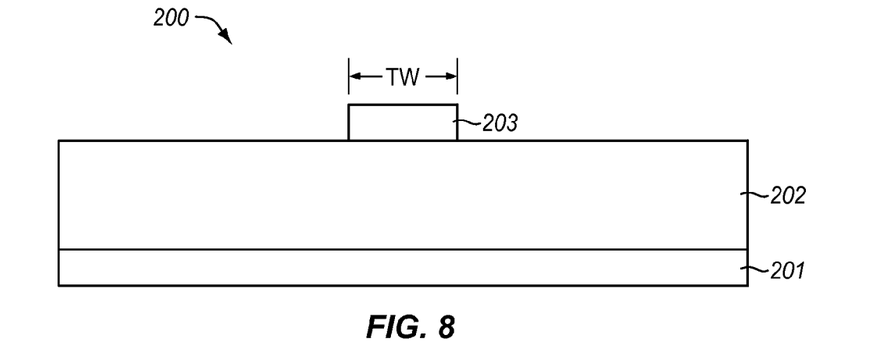
Figure 9:
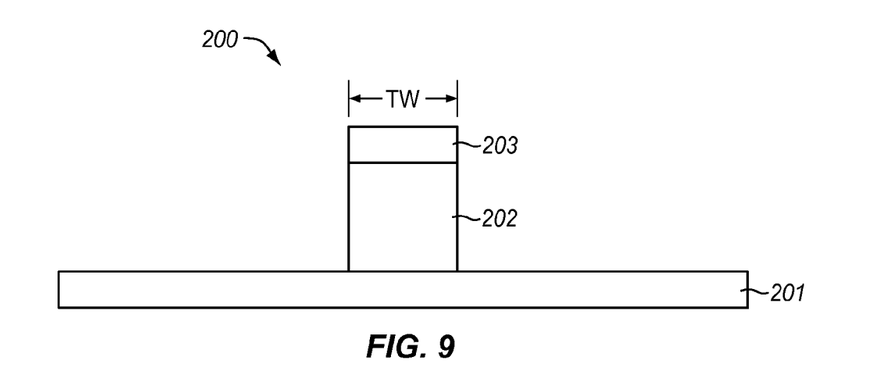

The layers 204 through 207 may then be removed using an aqueous stripping process, as shown in FIG. 8. For example, the upper layers of the film stack 200 (i.e., layers 204 through 207) may be removed using an aqueous solution consisting of Tetramethylammonium hydroxide (TMAH) and relatively hot N-Methyl-2-pyrrolidone (NMP), or another suitable material. In such an embodiment, the aspect ratio of the hard mask stencil is reduced, thereby reducing the shadowing effects during ion milling and improving deposition of subsequent layers. Thereafter, the sensor layer 202 may be ion milled so as to remove portions of the sensor material that lie outside the area of the patterned CMP stop layer 203, as shown in FIG. 9, and thereby define the magnetic read head 126 in the sensor layer 202.

Figure 10:
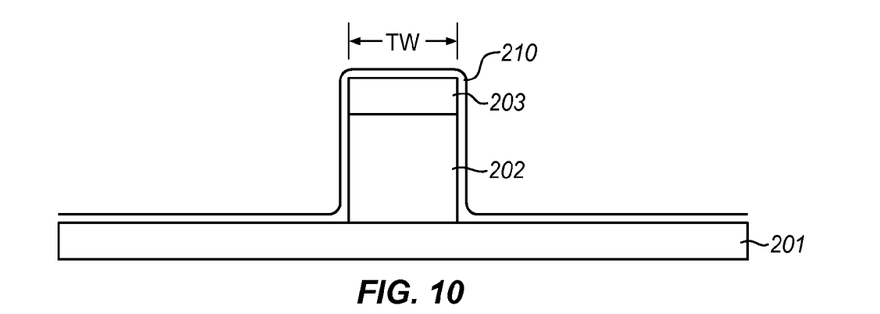
Figure 11:
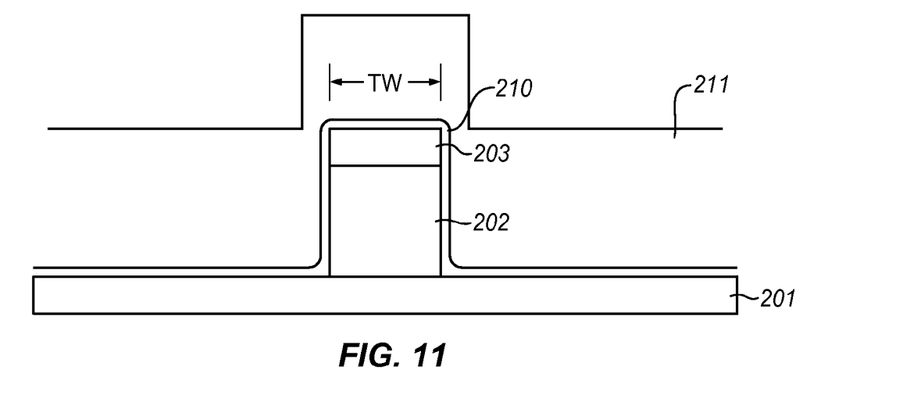
Figure 12:
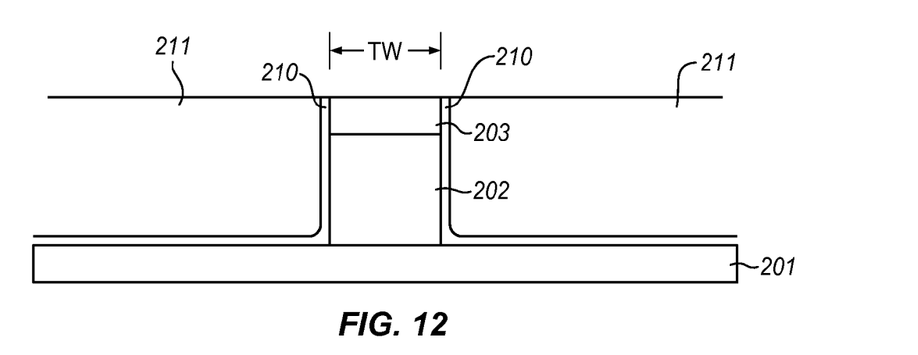
Figure 13:
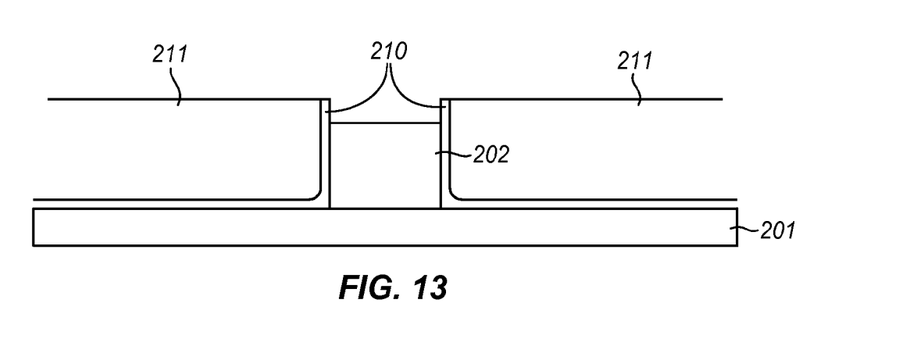
Figure 14:
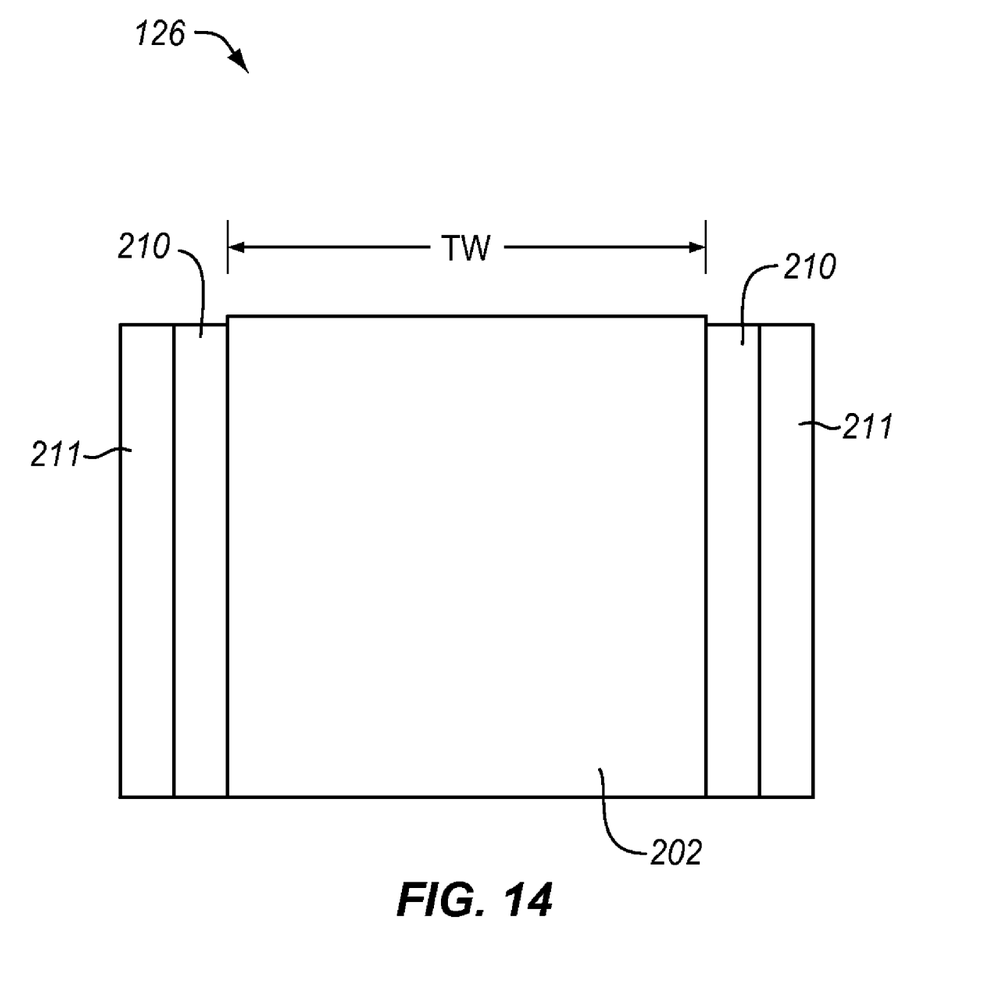

With the magnetic read head 126 shaped, the read head 126 is encased in a non conductive material 210 (e.g., alumina), as shown in FIG. 10, and further encased with a conductive and magnetic hard bias material 211, as shown in FIG. 11. Thereafter, the layers 210 and 211 above the CMP stop layer 203 and the sensor layer 202 are removed using a CMP process as illustrated in FIG. 12, thereby exposing the CMP stop layer 203 for processing via an RIE process (e.g., using $H_2$, $CO_2$, $O_3$ or $O_2$). This RIE process forms a notch in the hard bias fill as it removes the CMP stop layer 203, as shown in FIG. 13. The read head 126 may then be further processed to slim the remaining non-conductive material 210, the hard bias material 211, the Si adhesion layer, and the notch using, for example, another ion milling process. The notch is used to increase the separation between hard bias and the second shield to minimize field leakage from the hard bias to the second shield. The notch depth is generally controlled by adjusting the carbon thickness of the layer 203. The read head 126 may then be removed from the substrate 210, as shown in FIG. 14, such that leads may be attached to the read head 126 to ready it for configuration with the disk drive system 100 of FIG. 1 of FIG. 13.

Figure 15:
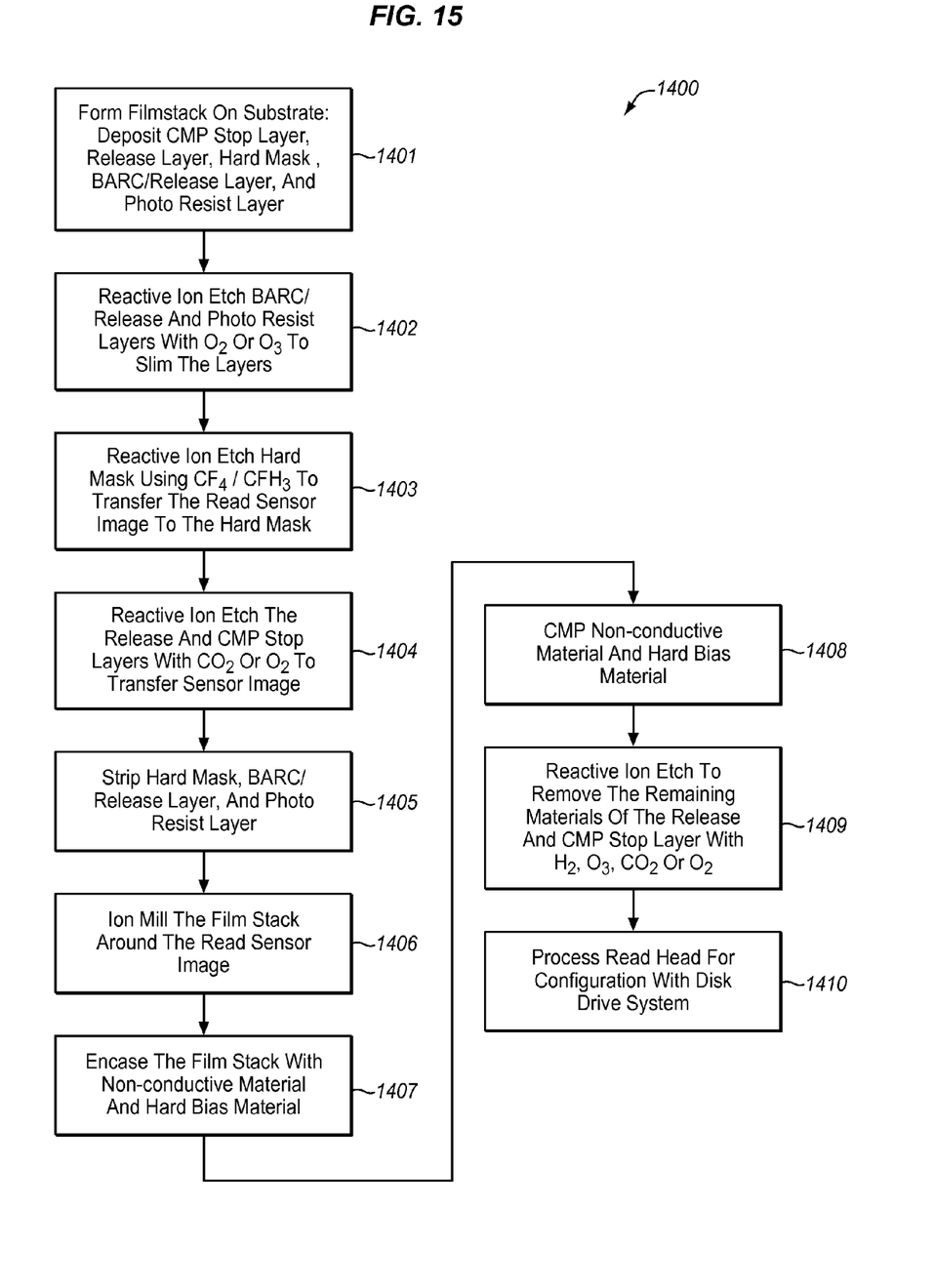
FIG. 15 is a flowchart of the chemical mechanical polishing assisted liftoff process used to fabricate the read head in an exemplary embodiment of the invention.

FIG. 15 is a flowchart of the chemical mechanical polishing assisted liftoff process 1400 used to fabricate the read head 126 in an exemplary embodiment of the invention. A film stack 200 is initiated on a substrate 201, in the process element 1401. The film stack 200 may be formed by layering a magnetic material 202 on the substrate 201 to form the magnetic read portion of the read head 126. Next, a CMP stop layer 203 (e.g., a DLC), a release layer 204 (e.g., Durimide), a hard mask 205, a BARC and release layer 206 (e.g., Durimide), and a photo resist layer 207 are deposited on the magnetic sensor layer 202. With the film stack formed, the BARC and release layer 206 and the photo resist layer 207 may be reactive ion etched using $O_2$ or $O_3$ to slim those layers, in the process element 1402. Thereafter, the hard mask 205 may be reactive ion etched using $CF_4/CHF_3$ to transfer the sensor image to the hard mask 205, in the process element 1403. Then, the release layer 206 and the CMP stop layer 203 may be reactive ion etched with $CO_2$ or $O_2$ to transfer the sensor image to those layers, in the process element 1404.

Once the film stack 200 has been processed, the film stack 200 is ion milled around the read sensor image, in the process element 1406. As mentioned, the film stack 200 may undergo an aqueous stripping process, in the process element 1405, to remove the layers 204 through 207 prior to ion milling of the process element 1406. Thereafter, the film stack 200 is encased in a nonconductive material 210 (e.g., alumina) and further encased with a hard bias material 211, in the process element 1407. Then, the film stack 200 undergoes a CMP to remove the portions of the hard bias material 211 and the nonconductive material 210 layers above the CMP stop layer 203, in the process element 1408, hard bias material 211 and the nonconductive material 210. Thereafter, the CMP stop layer 203 may be reactive ion etched using $H_2$, $O_3$, $CO_2$ or $O_2$ to removes those layers from the sensor layer 202, in the process element 1409. The remaining hard bias material 211 and the remaining nonconductive material 210 may then be slimmed (e.g., via ion milling) to remove the Si adhesion layer and the notch such that the read head 126 may be prepared for configuration with the disk drive system 100 of FIG. 1, in the process element 1410.

Figure 16:
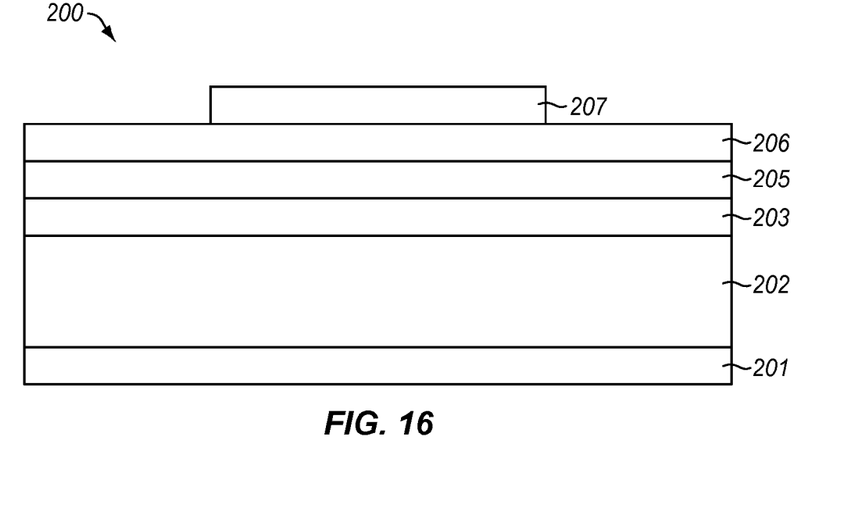
FIGS. 16-22 are elevational views depicting a series of steps in a direct chemical mechanical polishing fabrication process utilized in fabricating the read head in an exemplary embodiment of the invention.
Figure 17:
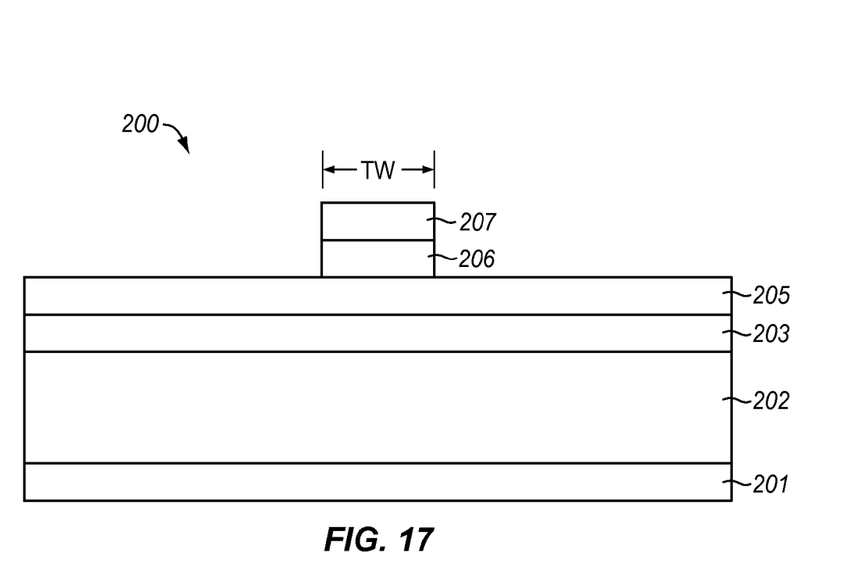
Figure 18:
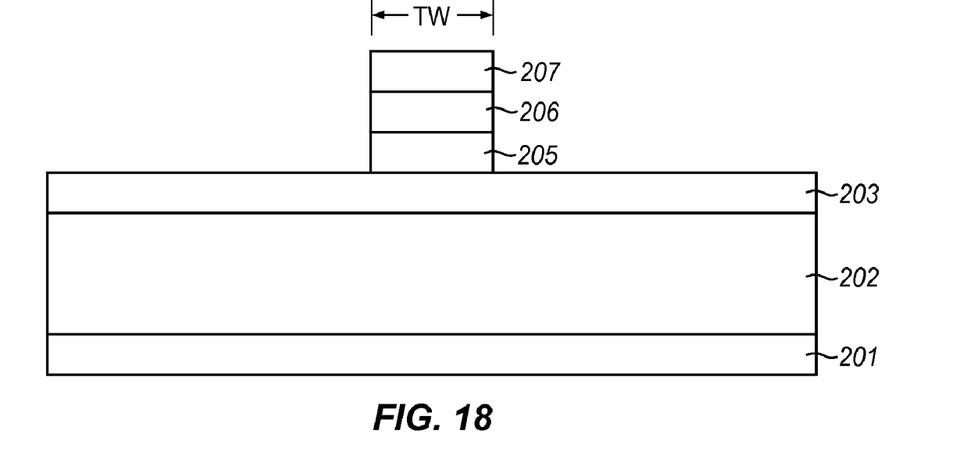
Figure 19:
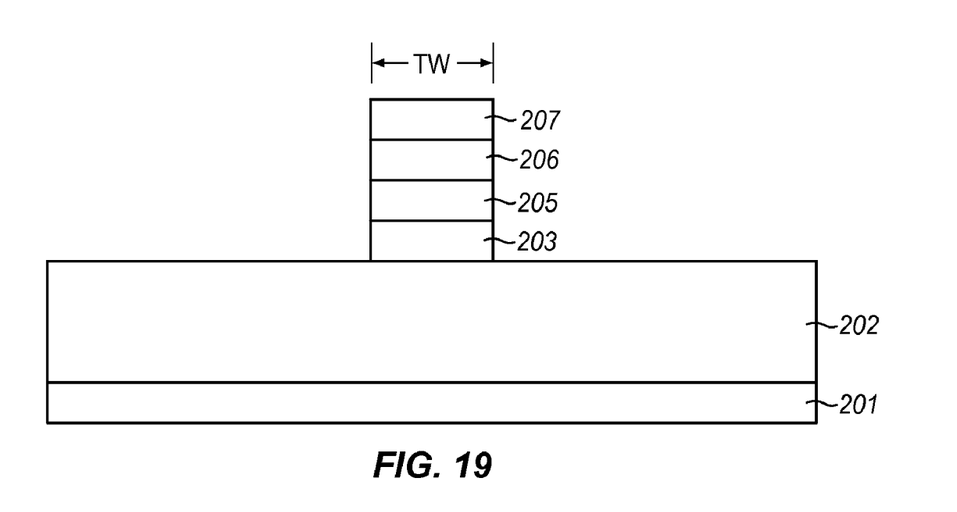

FIGS. 16-23 are elevational views depicting a series of steps in a direct chemical mechanical polishing fabrication process utilized in fabricating the read head 126 in an exemplary embodiment of the invention. In this embodiment, the film stack 200 as described above is fabricated without the release layer 204, as shown in FIG. 16. Processing of the film stack 200 in this embodiment therefore differentiates from the processing illustrated in FIGS. 4 through 15 by forgoing the use of stripping to remove the upper layers of the film stack 200 (i.e., the layers 204 through 207). However, similar read head track widths may still be achieved. Here, processing of the film stack 200 initiates using an RIE process that exposes the film stack 200 to a first material (e.g., $O_3$ or $O_2$) that narrows the photo resist layer 207 and the layer 206, as shown in FIG. 17, and defines the track width of the read head 126. Afterwards, the film stack 200 is exposed to a second RIE process that removes the layers 205 lying outside the area defined by the first RIE process, as shown in FIG. 18. This second RIE process may include exposing the film stack 200 to $CF_4$ and/or $CHF_3$ to transfer the read sensor image to the hard mask 205. Thereafter, a third RIE process may be used to image transfer the read head into the CMP stop layer 203 (e.g., using $CO_2$ or $O_2$), as shown in FIG. 19.

Figure 20:
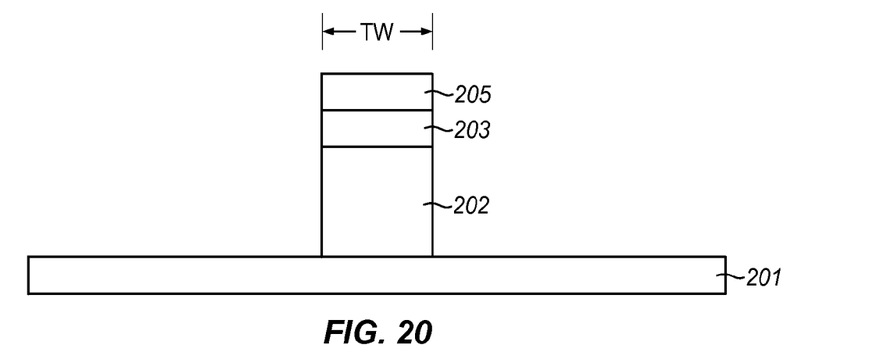

Once the track width of the read sensor image is defined in the CMP stop layer 203, the film stack 200 may be ion milled to remove portions of the sensor layer 202 lying outside the read sensor image, as shown in FIG. 20. Optionally, however, the layers 206 through 207 may be removed via an aqueous stripping prior to the second or third RIE steps. For example, before ion milling to define the read head 126 into the sensor layer 202, the upper layers of the film stack 200 (i.e., layers 206 through 207) may be removed using an aqueous solution consisting of Tetramethylammonium hydroxide (TMAH) and relatively hot N-Methyl-2-pyrrolidone (NMP), or another suitable material. In such an embodiment, the CMP process planarizes and removes materials to produce a flat surface while reducing the aspect ratio of the hard mask stencil, thereby reducing the shadowing effects during ion milling and improving deposition of subsequent layers. Thereafter, the sensor layer 202 may be ion milled so as to remove portions of the sensor material that lie outside the area of the patterned CMP stop layer 203, as shown in FIG. 20, and thereby define the magnetic read head 126.

Figure 21:
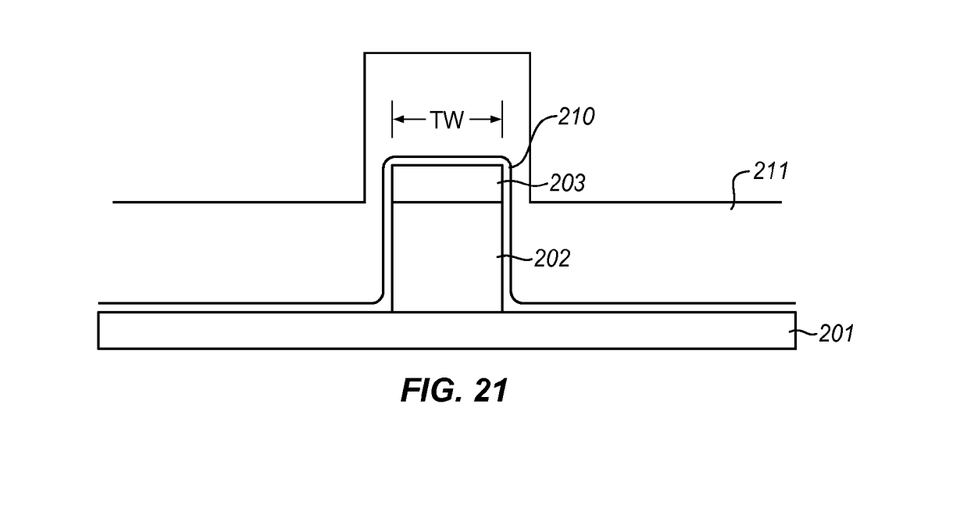
Figure 22:
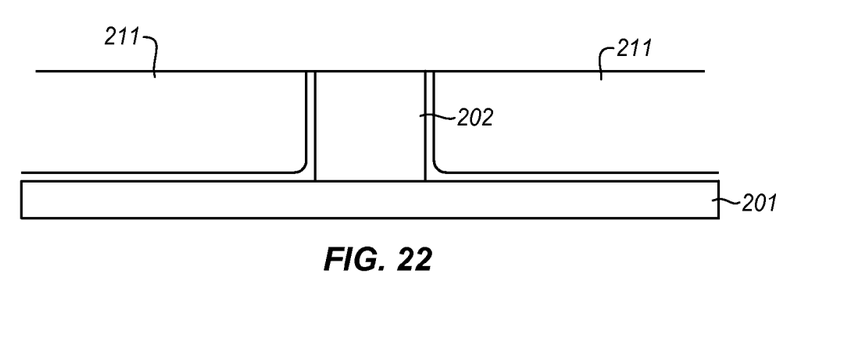

With the magnetic read head 126 shaped, the read head 126 is encased in a non conductive material 210 (e.g., alumina) and further encased with a conductive and magnetic hard bias material 211 as shown in FIG. 21. Thereafter, the layers 210 and 211 above the CMP stop layer 203 and the sensor layer 202 are removed using a CMP process as illustrated in FIG. 22. The read head 126 may then be further processed to slim the remaining non-conductive material 210, the hard bias material 211, the Si adhesion layer, and hence the notch using, for example, another ion milling process. The read head 126 may then be removed from the substrate 201 such that leads may be attached to the read head 126 to ready it for configuration with the disk drive system 100 of FIG. 1.

Figure 23:
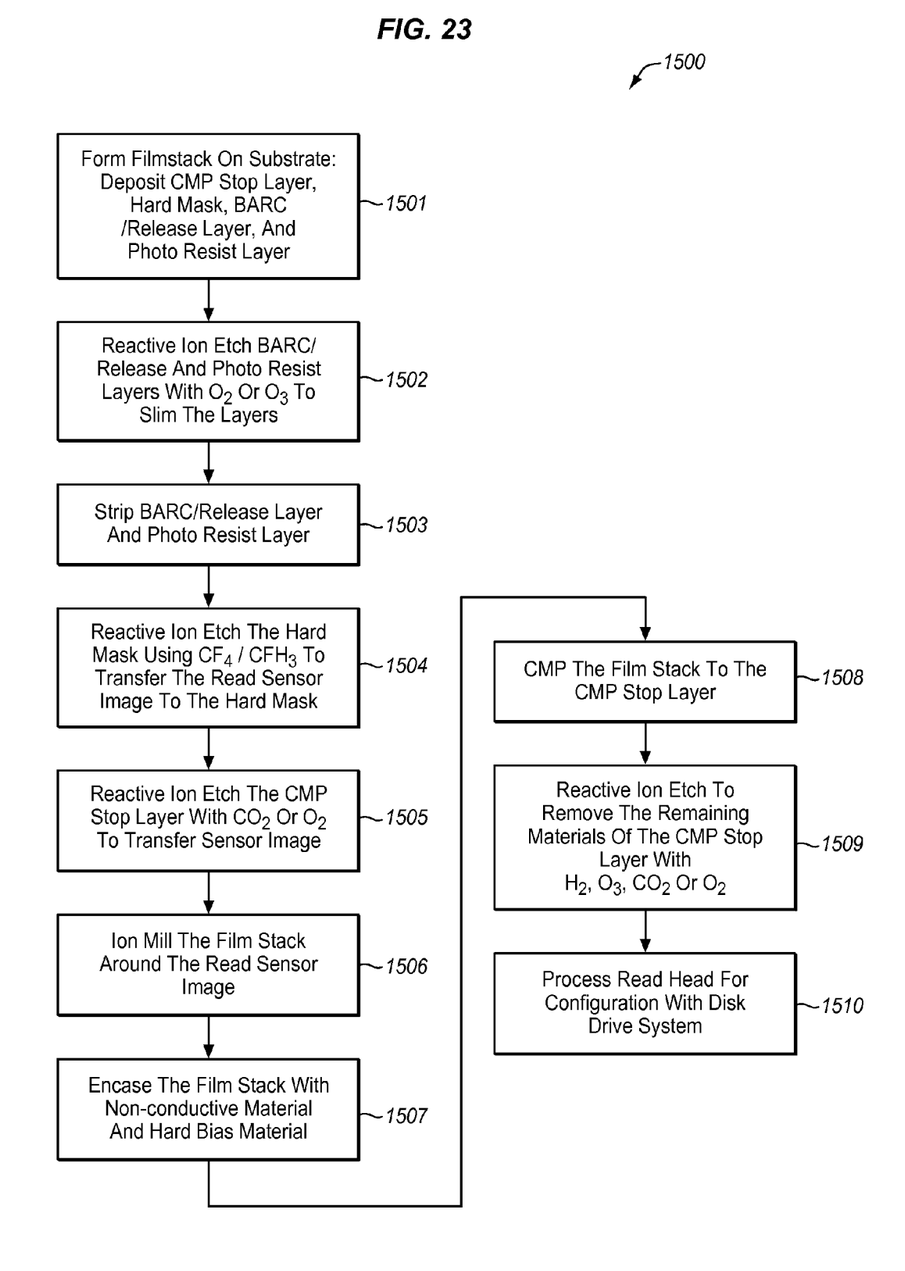
FIG. 23 is a flowchart of the direct chemical mechanical polishing process used to fabricate the read head in an exemplary embodiment of the invention.

FIG. 23 is a flowchart of the direct CMP process 1500 used to fabricate the read head in an exemplary embodiment of the invention. A film stack 200 is initiated on a substrate 201, in the process element 1501. The film stack 200 may be formed by layering a magnetic material 202 on the substrate 201 to form the magnetic read portion of the read head 126. Next, a CMP stop layer 203 (e.g., a DLC), a hard mask 205, a BARC and release layer 206 (e.g., Durimide), and a photo resist layer 207 are deposited on the magnetic sensor layer 202. With the film stack formed, the BARC and release layer 206 and the photo resist layer 207 may be reactive ion etched using $O_2$ or $O_3$ to slim those layers, in the process element 1502. Thereafter, the hard mask 205 may be reactive ion etched using $CF_4/CHF_3$ to transfer the sensor image to the hard mask 205, in the process element 1504. Then, the CMP stop layer 203 may be reactive ion etched with $CO_2$ or $O_2$ to transfer the sensor image to those layers, in the process element 1505.

Once the film stack 200 has been processed, the film stack 200 is ion milled around the read sensor image, in the process element 1506. As mentioned, the film stack 200 may undergo an aqueous stripping process, in the process element 1503, prior to the RIE processes of process elements 1504 and 1505, to remove the layers 206 through 207 prior to the ion milling of process element 1506. Thereafter, the film stack 200 is encased in a nonconductive material 210 (e.g., alumina) and further encased with a hard bias material 211, in the process element 1507. Then, the film stack 200 undergoes a CMP to remove the portions of the hard bias material 211 and the nonconductive material 210 layers above the CMP stop layer 203, in the process element 1508.

The CMP stop layer 203 may be reactive ion etched using $H_2$, $O_3$, $CO_2$ or $O_2$ to remove the layer from the sensor layer 202, in the process element 1509. The remaining hard bias material 211 and the remaining nonconductive material 210 may then be slimmed (e.g., via ion milling) such that the read head 126 may be prepared for configuration with the disk drive system 100 of FIG. 1, in the process element 1510.

Although specific embodiments were described herein, the scope of the invention is not limited to those specific embodiments. The scope of the invention is defined by the following claims and any equivalents thereof.

We claim:

1. A method of manufacturing a read head, the method comprising:
    fabricating a film stack by:
        forming a sensor layer on a substrate, wherein the sensor layer is configured from a magnetic material;
        forming a stop layer on the sensor layer, wherein the stop layer is configured from a material that deters removal of the sensor layer during chemical mechanical polishing;
        forming a release layer on the stop layer, wherein the release layer is configured from a first release material;
        forming a mask layer on the release layer, wherein the mask layer is configured from a material that transfers an image of the read head from a photo resist layer onto the release layer, wherein the step of forming the mask layer comprises layering a second release material between the mask layer and the photo resist layer; and forming the photo resist layer on the mask layer; and
    patterning the read head image in the photo resist layer;
    etching the stop layer, the release layer and the mask layer according to the patterned read head image;
    stripping the photo resist layer, the release layer and the mask layer; and
    milling the sensor layer according to the patterned read head image of the remaining stop layer.

2. The method of claim 1, wherein the first and second release materials are polyamide materials.

3. The method of claim 1, wherein the stop layer material is carbon.

4. The method of claim 1, wherein the photo resist layer material is TIS.

5. The method of claim 1, wherein the mask layer material includes $Si_3N_4$.

6. The method of claim 1, wherein said etching the stop layer, the release layer, and the mask layer according to the patterned read head image comprises:
    first reactive ion etching the mask layer using a first reactive ion etching material; and
    second reactive ion etching the release layer and the stop layer using a second reactive ion etching material, wherein the first and second reactive ion etching materials are different.

7. The method of claim 6, wherein the first reactive ion etching material is selected from a group consisting of $CF_4$ and $CHF_3$ and wherein the second reactive ion etching material is selected from a group consisting of $O_2$ and $O_3$.

8. The method of claim 1, wherein said patterning the read head image in the photo resist layer comprises first reactive ion etching the photo resist layer using a first reactive ion etching material to remove a portion of the photo resist layer and form the read head image.

9. The method of claim 8, wherein said etching the stop layer, the release layer, and the mask layer according to the patterned read head image comprises:
    second reactive ion etching the mask layer material using a second reactive ion etching material; and
    third reactive ion etching the release layer and the stop layer using a third reactive ion etching material wherein the first and second reactive ion etching materials are different.

10. The method of claim 9, wherein the third reactive ion etching material is selected from a group consisting of $CO_2$ and $O_2$.

11. The method of claim 1, further comprising:
encasing the read head with two or more encasing materials;
wherein said chemical mechanical polishing is performed on the read head to remove a portion of the two or more encasing materials from the read head; and
notching the read head.

12. The method of claim 1, wherein the mask layer is selected from a group consisting of: $Si_3N_4$; $SiO_2$; $SiO_xN_y$; Ta: $Ta_2N_3$: $Ta_2O_5$: and W.

* * * * *